United States Patent [19]

Fischman et al.

[11] 3,999,101
[45] Dec. 21, 1976

[54] HORIZONTAL DEFLECTION SYSTEM

[75] Inventors: Martin Fischman, Seneca Falls; Jesse H. L'Hommedieu, Waterloo, both of N.Y.

[73] Assignee: GTE Sylvania Incorporated, Stamford, Conn.

[22] Filed: July 30, 1975

[21] Appl. No.: 600,404

[52] U.S. Cl. .............................. 315/408; 315/399
[51] Int. Cl.² ................... H01J 29/70; H01J 29/76
[58] Field of Search .......... 315/399, 407, 408, 387

[56] References Cited

UNITED STATES PATENTS

| | | | |
|---|---|---|---|
| 3,423,631 | 1/1969 | Geller et al. | 315/408 |
| 3,467,882 | 9/1969 | Young | 315/408 |
| 3,784,871 | 1/1974 | Vacher | 315/408 |

OTHER PUBLICATIONS

P. L. Wessel, "A new Hor. Out. Defl. Ckt.,' IEEE. *Transactions on Broadcast & TV Receivers*, vol. BTR-18, Aug. 1972, pp. 177-182.

*Primary Examiner*—T.H. Tubbesing
*Assistant Examiner*—T. M. Blum
*Attorney, Agent, or Firm*—Norman J. O'Malley; Robert E. Walrath; Robert T. Orner

[57] ABSTRACT

A horizontal deflection system with a transformer coupled driver including separate trace and retrace drivers coupled to an input winding or windings of the driver transformer is shown. A feedback or pulse forming means is connected from the transformer to the input of the retrace driver for providing a pulse to the retrace driver in response to termination of the trace drive signal by the trace driver.

12 Claims, 4 Drawing Figures

HORIZONTAL DEFLECTION SYSTEM

CROSS-REFERENCE TO RELATED APPLICATIONS

M. Fischman et al., "Horizontal Deflection System", Ser. No. 600,403, and M. Fischman et al., "Horizontal Deflection System", Ser. No. 600,405, filed concurrently herewith and assigned to the same assignee as the present invention.

FIELD OF THE INVENTION

This invention relates to horizontal deflection systems and more particularly to a driver circuit for transformer coupled driver circuitry for horizontal deflection systems.

BACKGROUND OF THE INVENTION

The above-referenced applications disclose unique transformer coupled driver circuitry for both fixed duty cycle horizontal deflection systems and self-regulating horizontal deflection systems. In the disclosed driver circuitry separate trace and retrace drivers are utilized. While the driver circuitry disclosed in the above-referenced applications operates satisfactorily, it has been found that in some applications it is desirable to provide assurance that the trace and retrace drivers are not conducting at the same time. Furthermore, in some applications an additional transistor stage used to invert the signal applied to one of the drivers can be eliminated.

OBJECTS OF THE INVENTION

Accordingly, it is a primary object of this invention to provide an improved driver circuit for a horizontal deflection system.

It is a further object of this invention to provide a simplified driver circuit for a horizontal deflection system.

It is a further object of this invention to provide a driver circuit wherein trace and retrace drivers cannot conduct at the same time.

It is a still further object of this invention to provide a driver circuit for both fixed duty cycle and self-regulating horizontal deflection systems.

SUMMARY OF THE INVENTION

In one aspect of this invention the above and other objects and advantages are achieved in a driver circuit for a horizontal deflection system in a television receiver having a horizontal oscillator and a horizontal output stage. The driver circuit includes trace and retrace drivers or semiconductor switches, transformer means, and feedback or pulse forming means. The trace semiconductor switch has an input electrode connected to the oscillator. The transformer means is connected to output electrodes of the trace and retrace semiconductor switches and has an output winding connected to the horizontal output stage for providing trace and retrace drive signals to the horizontal output stage. The feedback or pulse forming means is connected to the transformer means and to the input electrode of the retrace and semiconductor switch for providing a pulse to the retrace semiconductor switch in response to termination of the trace drive signal by the trace semiconductor switch.

DETAILED DESCRIPTION OF THE PREFERRED EMBODIMENTS

For a better understanding of the present invention, together with other and further objects, advantages and capabilities thereof, reference is made to the following disclosure in conjunction with the accompanying drawings.

Figure 1:
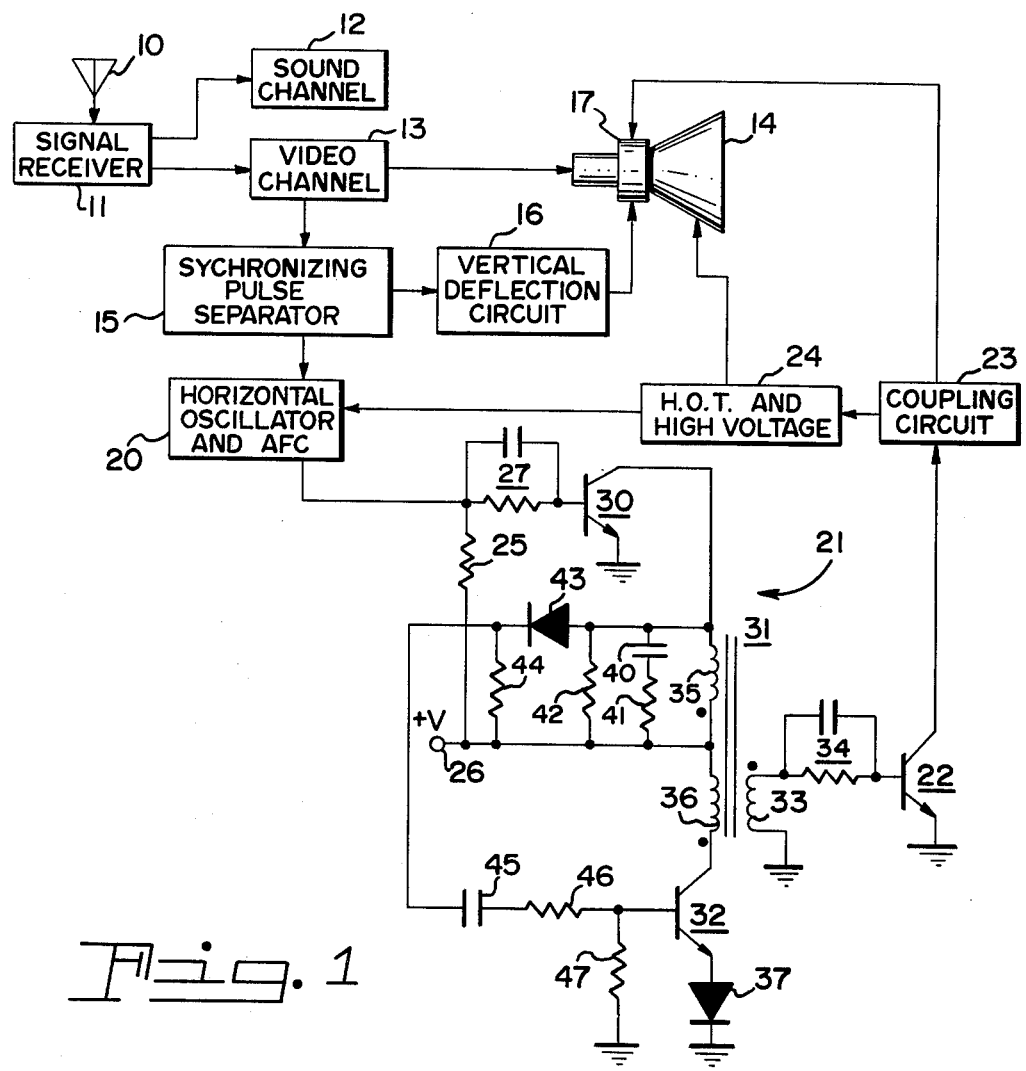
FIG. 1 is a block and schematic diagram of a preferred embodiment of the invention incorporated in a television receiver.

In FIG. 1 components found in typical television receivers are shown in block form while the invention is shown schematically. An antenna 10 or equivalent signal receiving means is connected to a signal receiver 11 which receives and processes television signals in the usual manner. Signal receiver 11 provides the sound portion of the received signal to a sound channel 12 and the video portion to a video channel 13. Video channel 13 includes the usual luminance circuitry, and in the case of a color television receiver, the usual chrominance circuitry. Video channel 13 provides one or more output signals to a cathode ray tube (CRT) 14. The received composite video signal is coupled from video channel 13 to a synchronizing pulse separator 15 which provides separated vertical synchronizing pulses to vertical deflection circuit 16. Vertical deflection circuit 16 provides a vertical deflection signal to the vertical deflection windings contained in a deflection yoke 17 associated with CRT 14.

Separated horizontal synchronizing pulses are coupled from synchronizing pulse separator 15 to horizontal oscillator and automatic frequency control (AFC) 20. The horizontal oscillator is connected via a driver circuit 21 to a horizontal output stage including a horizontal output transistor 22. The collector of transistor 22 is connected via a coupling circuit 23 to the horizontal deflection winding contained in yoke 17. Coupling circuit 23 also couples the collector of transistor 22 to a horizontal output transformer and high voltage circuit 24 which provides the usual high operating voltages to CRT 14. Regulated low operating voltages can also be derived from circuit 24 if desired. A feedback signal for synchronizing and/or voltage regulation purposes is coupled via coupling circuit 23 and circuit 24 to horizontal oscillator and AFC 20. Further description of the horizontal deflection system in both fixed duty cycle and self-regulating modes of operation is contained in the above-referenced applications.

The output of horizontal oscillator 20 is connected by a resistor 25 to a source of energizing voltage illustrated as a terminal 26. The output of oscillator 20 is further connected by a parallel RC circuit 27 to an input electrode of a trace driver or semiconductor switch illustrated as an input electrode or base of a driver transistor 30 which has an emitter connected to circuit ground. An output electrode illustrated as a collector of transistor 30 is connected to a transformer means 31. A retrace semiconductor switch 32 has an output electrode also connected to transformer means 31. Transformer means 31 has an output winding 33 with one end connected to circuit ground while the other end is connected by a parallel RC circuit 34 to a base of transistor 22 which has an emitter connected to circuit ground.

Preferably, transformer means 31 has first and second input windings 35 and 36 and is designed and operates in accordance with that disclosed in the above-referenced applications. In the illustrated embodiment, the collector of transistor 30 is connected to one end of winding 35 and source 26 is connected to the other end of winding 35. Semiconductor switch 32 is illustrated as a transistor having an emitter connected by a diode 37 to circuit ground and an output electrode illustrated as a collector connected to one end of input winding 36 the other end of which is connected to source 26. A damping circuit is connected in parallel with input winding 35. The damping circuit includes a capacitor 40 and a resistor 41 connected in series across winding 35 and a resistor 42 connected in parallel with winding 35.

A feedback means or pulse forming means is connected to transformer 31 and to an input electrode of semiconductor switch 32. The feedback or pulse forming means includes a clipping circuit illustrated as a diode 43 and a resistor 44 connected in series across winding 35. The junction between diode 43 and resistor 44 is connected by a capacitor 45 in series with a resistor 46 to the input electrode illustrated as a base of transistor 32. The base of transistor 32 is further connected by a resistor 47 to circuit ground.

In operation, oscillator 20 provides pulses which can either have a fixed duty cycle or be pulse width modulated as is described in the above-referenced applications. The pulses from oscillator 20 are coupled to the base of driver transistor 30 which operates as a trace semiconductor switch to couple pulses of current from source 26 through input winding 35 of transformer 31. The pulses of current through input winding 35 cause a trace drive signal to be generated in output winding 33 which is coupled to horizontal output transistor 22.

Retrace in a horizontal deflection system is initiated by cutting off the current conduction of the horizontal output transistor. Accordingly, at the end of each of the pulses from oscillator 20, transistor 30 is switched off so that current flow through input winding 35 ceases. In order to provide rapid turn-off of horizontal output transistor 22, retrace semiconductor switch 32 is provided. If transistors 30 and 32 both became conductive at the same time, improper operation of the horizontal deflection system will result with possible damage to circuit components. To prevent simultaneous conduction by transistors 30 and 32, transistor 32 is triggered in response to termination of the trace drive signal by transistor 30.

Figure 2:
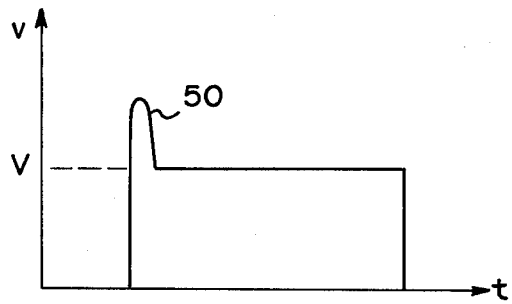
FIG. 2 is a waveform diagram to aid in explaining the operation of the embodiment of FIG. 1.

The collector voltage waveform of transistor 30 is generally illustrated in FIG. 2. When transistor 30 is in a conducting state or on during trace, its collector potential is approximately circuit ground. When transistor 30 is switched to a non-conducting state or off at the end of trace, the inductive reaction of input winding 35 causes a voltage pulse 50 to be developed at the collector of transistor 30. When the voltage pulse 50 disappears, the off collector voltage of transistor 30 is approximately equal to the voltage of source 26. The clipping circuit including diode 43 and resistor 44 clip pulse 50 and couple it via capacitor 45 and resistor 46 to the base of transistor 32 to switch transistor 32 to a conducting state or on. When transistor 32 is on, a retrace drive signal is coupled from winding 36 to winding 33 to switch horizontal output transistor 22 off. The damping circuit including capacitor 40 and resistors 41 and 42 determine the amplitude of pulse 50, and hence, the amplitude of the retrace pulse applied to the base of transistor 32. The duration of the retrace pulses is determined by the duration of pulse 50 at the collector of transistor 30 and the charging time constant of capacitor 45.

Figure 3:
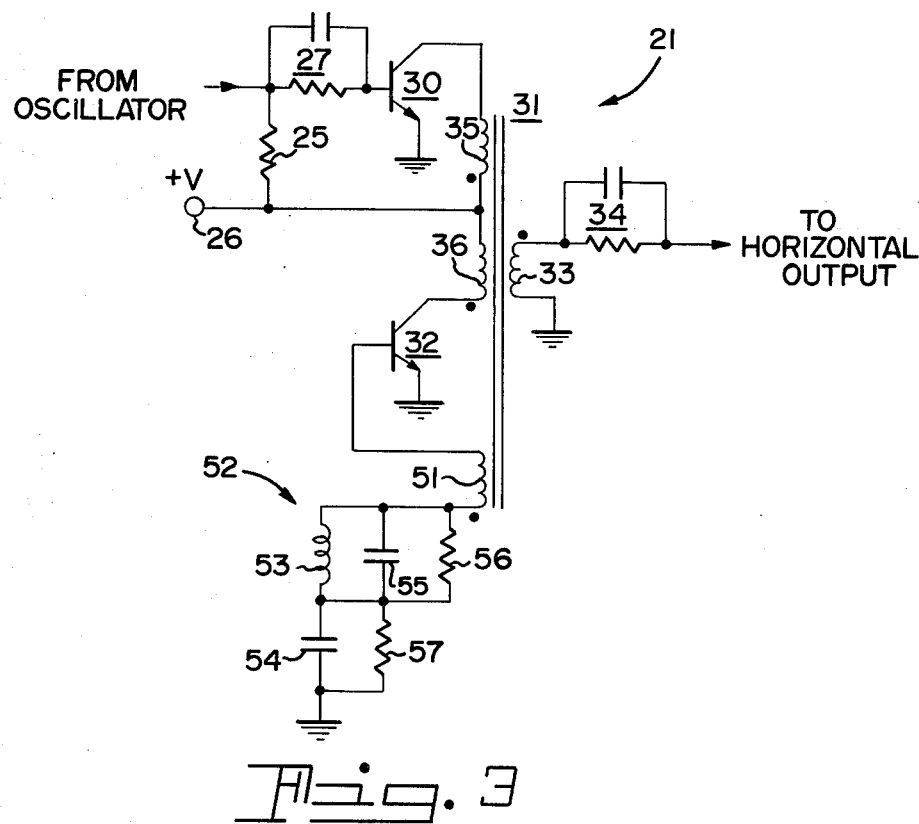
FIG. 3 is a schematic diagram of another preferred embodiment of the invention.

FIG. 3 is a schematic illustration of another embodiment of driver circuit 21. Components which perform the same function in FIG. 3 as in FIG. 1 are numbered the same. In FIG. 3 diode 37 and damping circuit 40–42 are not illustrated, however, they can be provided if desired or necessary.

The feedback or pulse forming means including clipping circuit 43–44 and components 45–47 of FIG. 1 are replaced in FIG. 3 by a feedback winding 51 on transformer 31 and an oscillatory circuit 52. One end of winding 51 is connected to the base of transistor 32 while the other end is connected to oscillatory circuit 52. Oscillatory circuit 52 includes an inductance illustrated as a coil 53 and a capacitance illustrated as a capacitor 54 connected in series between winding 51 and circuit ground. A capacitor 55 is connected in parallel with coil 53. A damping resistor 56 is connected in parallel with coil 53. A resistor 57 is connected in parallel with capacitor 54 for discharging capacitor 54. In FIG. 3 dots are added to the windings of transformer 31 to illustrate the relative winding directions of the windings.

When transistor 30 is conducting, current flow through winding 35 causes a negative voltage to be developed by winding 51 at the base of transistor 32 to hold transistor 32 in a non-conducting state. When transistor 30 switches off, a positive voltage is developed by winding 51 at the base of transistor 32 to cause transistor 32 to switch to a conducting state to provide a retrace drive signal to the horizontal output transistor. Coil 53 and capacitor 54 have values such that they oscillate for one-half cycle during which time transistor 32 is held in a conducting state. After one-half cycle of oscillation, the voltage at the base of transistor 32 becomes negative to switch transistor 32 to a non-conducting state thereby terminating the retrace drive signal. Since it is desired to switch transistor 32 on rapidly, capacitor 55 is provided in series with capacitor 54 to rapidly switch transistor 32 on.

Figure 4:
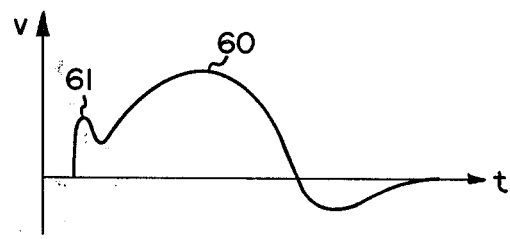
FIG. 4 is a waveform diagram to aid in explaining the operation of the embodiment of FIG. 3.

The base voltage of transistor 32 is illustrated in FIG. 4. In general, the oscillatory waveform 60 of FIG. 4 is provided by coil 53 and capacitor 54 together with feedback winding 51. The initial turn-on pulse 61 of FIG. 4 is provided by capacitor 55 which shunts the initial current around coil 53. Accordingly, the values of coil 53 and capacitor 54 determine the duration of the retrace drive signal while the value of capacitor 55 determines how rapidly transistor 32 switches on.

Accordingly, novel driver circuitry has been illustrated and described. A driver circuit in accordance with the invention assures that both the trace and retrace drivers or semiconductor switches are not on or conducting at the same time. Since the retrace driver is triggered by the termination of the trace drive signal, an inverter stage between the oscillator and the retrace driver is not required.

While there has been shown and described what is at present considered the preferred embodiments of the invention it will be obvious to those skilled in the art that various changes and modifications may be made therein without departing from the invention as defined by the appended claims.

What is claimed is:

1. A driver circuit for a horizontal deflection system in a television receiver having a horizontal oscillator and a horizontal output transistor comprising:
   a transformer having an output winding connected to said horizontal output transistor and first and second input windings;
   a driver transistor having an input electrode connected to said oscillator and an output electrode connected to said first input winding for providing a trace drive signal to said horizontal output transistor;
   a semiconductor switch having an output electrode connected to said second input winding for providing a retrace drive signal to said horizontal output transistor; and
   pulse forming means connected to said transformer and to an input electrode of said semiconductor switch for providing a pulse to said semiconductor switch in response to termination of said trace drive signal by said driver transistor for causing said semiconductor switch to provide said retrace drive signal.

2. A driver circuit as defined in claim 1 wherein said pulse forming means includes a clipping circuit connected to said first input winding and to said input electrode of said semiconductor switch for clipping pulses induced in said first input winding in response to said driver transistor switching to a non-conducting state.

3. A driver circuit as defined in claim 2 wherein said clipping circuit includes a diode and resistor connected in parallel with said first input winding with the junction of said diode and resistor being connected to said input electrode of said semiconductor switch.

4. A driver circuit as defined in claim 1 wherein said pulse forming means includes an oscillatory circuit and a feedback winding on said transformer connected between said input electrode of said semiconductor switch and said oscillatory circuit.

5. A driver circuit as defined in claim 4 wherein said oscillatory circuit including a series inductance and capacitance with a resonant frequency for determining the conduction time of said semiconductor switch.

6. A driver circuit for a horizontal deflection system in a television receiver having a horizontal oscillator and horizontal output transistor comprising:
   a trace semiconductor switch having an input electrode connected to said oscillator and an output electrode;
   a retrace semiconductor switch having an input electrode and an output electrode;
   transformer means connected to said output electrodes of said trace and retrace semiconductor switches and having an output winding connected to said horizontal output transistor for providing trace and retrace drive signals to said horizontal output transistor in response to conduction by said trace and retrace semiconductor switches, respectively; and
   feedback means connected to said transformer means and to said input electrode of said retrace semiconductor switch for providing a pulse to said retrace semiconductor switch in response to termination of said trace drive signal by said trace semiconductor switch for causing said retrace semiconductor switch to provide said retrace drive signal.

7. A driver circuit as defined in claim 6 wherein said feedback means includes an oscillatory circuit and a feedback winding on said transformer connected between said input electrode of said retrace semiconductor switch and said oscillatory circuit.

8. A driver circuit as defined in claim 7 wherein said oscillatory circuit includes a series inductance and capacitance with a resonant frequency for determining the conduction time of said retrace semiconductor switch.

9. A driver circuit as defined in claim 8 wherein said oscillatory circuit includes a capacitor for rapidly switching said retrace semiconductor switch to a conducting state.

10. A driver circuit as defined in claim 6 wherein said transformer means includes first and second input windings connected to said output electrodes of said trace and retrace semiconductor switches, respectively.

11. A driver circuit as defined in claim 10 wherein said feedback means includes a clipping circuit connected to said first input winding and to said input electrode of said retrace semiconductor switch for clipping pulses induced in said first input winding in response to said trace semiconductor switch switching to a non-conducting state.

12. A driver circuit as defined in claim 11 wherein said clipping circuit includes a diode and resistor connected in parallel with said first input winding with the junction of said diode and resistor being connected to said input of said retrace semiconductor switch.

* * * * *